(12) United States Patent
Lee et al.

(10) Patent No.: US 7,354,871 B2
(45) Date of Patent: Apr. 8, 2008

(54) NANOWIRES COMPRISING METAL NANODOTS AND METHOD FOR PRODUCING THE SAME

(75) Inventors: Eun Kyung Lee, Suwon-si (KR); Byoung Lyong Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/506,091

(22) Filed: Aug. 17, 2006

(65) Prior Publication Data

US 2007/0111493 A1   May 17, 2007

(30) Foreign Application Priority Data

Nov. 7, 2005   (KR) ............. 10-2005-0106040
Jan. 17, 2006   (KR) ............. 10-2006-0004919

(51) Int. Cl.
  *H01L 21/31*   (2006.01)
  *H01L 21/469*   (2006.01)
(52) U.S. Cl. .......... 438/758; 257/E29.07; 977/700; 977/762
(58) Field of Classification Search .......... 257/1, 257/9; 438/758; 977/762
  See application file for complete search history.

(56) References Cited

U.S. PATENT DOCUMENTS

| | | | |
|---|---|---|---|
| 7,105,428 B2 * | 9/2006 | Pan et al. | 438/584 |
| 2002/0172820 A1 * | 11/2002 | Majumdar et al. | 428/357 |
| 2007/0046164 A1 * | 3/2007 | Subramanian | 313/309 |

OTHER PUBLICATIONS

Article by C.P. Li, et al, and entitled "Silicon Nanowires Wrapped with Au Film" J. Phys. Chem. B, vol. 106, No. 28, 2002, American Chemical Society; Published on Web Jun. 22, 2002; pp. 6980-6984.

* cited by examiner

*Primary Examiner*—Walter Lindsay, Jr.
*Assistant Examiner*—Abdulfattah Mustapha
(74) *Attorney, Agent, or Firm*—Cantor Colburn LLP

(57) ABSTRACT

Nanowires methods for producing the nanowires are provided. The nanowires include a plurality of metal nanodots uniformly disposed therein, and a core portion, wherein each of the plurality of metal nanodots is coupled to the core portion. According to the method, metal nanodots can be uniformly disposed in the nanowires, and nanowires having various physical properties can be produced by controlling the size and interval of the nanodots. Therefore, the nanowires can be effectively used in a variety of applications, including electronic devices, such as field effect transistors (FETs), sensors, photodetectors, light emitting diodes (LEDs), and laser diodes (LDs).

7 Claims, 5 Drawing Sheets

Au metal dot

Si/SiO$_2$ nanowire

Au metal dot
Si/SiO₂ nanowire

NANOWIRES COMPRISING METAL NANODOTS AND METHOD FOR PRODUCING THE SAME

This application claims priority to Korean Patent Application No. 2005-106040 filed on Nov. 07, 2005 and to Korean Patent Application No. 2006-0004919 filed on Jan. 17, 2006 and all the benefits accruing therefrom under 35 U.S.C. § 119, the contents of which are herein incorporated by reference in their entireties.

BACKGROUND OF THE INVENTION

1. Field of the Invention

The present invention relates to nanowires including metal nanodots and a method for producing the nanowires. More particularly, the present invention relates to a new structure of nanowire including a plurality of metal nanodots uniformly disposed therein, and a method for producing the nanowires.

2. Description of the Related Art

Nanowires are linear materials whose diameter is in the nanometer range (1 nm=$10^{-9}$ m) and whose length is greater than the diameter. Nanowires can have a length on the order of several hundred nanometers, micrometers (1 μm=$10^{-6}$ m), or millimeters (1 mm=$10^{-3}$ m). Nanowires exhibit various physical properties depending on their diameter and length.

Extensive research on the production and physical properties of nanoparticles is now being actively undertaken, but fewer studies on methods for producing nanowires have been reported. Representative methods for producing nanowires include the template approach, chemical vapor deposition (CVD), laser ablation, and the like.

According to the template approach, pores having a size of a few to several hundred nanometers are used as templates to produce nanowires. In one example, an aluminum electrode is first oxidized to form aluminum oxide on the surface of the electrode, and then the aluminum oxide is electrochemically etched to form nanoscale pores. The resulting structure is dipped in a solution containing metal ions. When electricity is applied to the solution, the metal ions accumulate on the aluminum electrode through the pores, until the pores are filled with the metal ions. Thereafter, the oxide is removed by appropriate treatment to leave metal nanowires behind.

However, since the template approach is a laboratory method and can be complicated and time-consuming to implement, it is not ideal for mass production of nanowires. The diameter and length of the nanowires depend on the size and depth of the pores, and it can be very difficult to form pores having a size on the order of a few nanometers and a depth ranging from a few hundred micrometers to a few millimeters. Therefore, the template approach is limited in that it is very difficult to produce nanowires having a diameter of a few nanometers.

With chemical vapor deposition (CVD), a raw material gas containing a desired material is fed into a reactor and decomposed (e.g., by heat or plasma energy) within the reactor. A substrate is exposed to the desired material to form nanotubes or nanowires thereon. Such chemical vapor deposition methods are divided into low-pressure chemical vapor deposition (LPCVD), atmospheric-pressure chemical vapor deposition (APCVD) and high-pressure chemical vapor deposition (HPCVD) based on the inner pressure of the reactor.

One type of CVD method is plasma-enhanced chemical vapor deposition (PECVD), which makes use of a relatively low temperature plasma to form the nanomaterials. For example, carbon nanotubes or nanowires can be produced by using a hydrocarbon gas (e.g., methane) as a raw material gas and dispersing transition metal nanoparticles (e.g., nickel, cobalt and iron particles) on a glass substrate. It is necessary to form a transition metal thin film before growth of the carbon nanotubes or nanowires. The transition metal acts as a catalyst for decomposing the raw material gas and a nucleation site for the formation of the nanotubes or nanowires. Many nanomaterials are produced and grown on wafers in this fashion.

Laser ablation can be used to produce monolayers of carbon nanotubes and semiconductor nanowires. Laser ablation has advantages over other production methods in that nanomaterials can be produced with high purity or are easily purified. In one example, a transition metal and a basic bulk material for producing nanomaterials are mixed in a predetermined ratio to prepare a specimen. The specimen is then placed inside a quartz tube, and evaporated using an externally applied laser to produce the nanotubes or nanowires. Argon is commonly used as a buffer gas. The nanotubes or nanowires thus prepared and the buffer gas are transferred and attached to or around a cooled collector.

The nanowires produced by these methods can be used in electronic devices, such as field effect transistors (FETs), sensors, photodetectors, and the like. In addition, nanowires containing metal nanodots can be used as waveguides utilizing optical coupling of the metal nanodots or can be use in highly photosensitive detectors for cell diagnosis in the field of biotechnology. In addition, such nanowires could be applied to metal base transistors having a metal-silicon-metal structure and devices with newly added functions.

A few methods for producing nanowires comprising metal nanodots are known. For example, gold atoms can be deposited on the surface of grown nanowires and then introduced inside the nanowires. One example of such a method is schematically shown in FIG. 4. According to this method, however, all of the gold (Au) atoms or nanodots cannot be introduced into the nanowires. Furthermore, the positions of the gold atoms or nanodots attached on the surface of the nanowires are not controlled, and are instead randomly distributed. Therefore, the method has disadvantages in that the gold atoms cannot be uniformly disposed within the nanowires and it is difficult to control the size of the gold atoms.

BRIEF SUMMARY OF THE INVENTION

The present invention overcomes the problems described above, and an aspect of the present invention includes providing nanowires comprising a plurality of metal nanodots uniformly disposed therein.

Another aspect of the present invention includes providing a method for producing the nanowires.

In accordance with an exemplary embodiment of the present invention, a nanowire includes a plurality of metal nanodots uniformly disposed therein, and a core portion, wherein each of the plurality of metal nanodots is coupled to the core portion.

In accordance with another exemplary embodiment of the present invention, a method for producing nanowires includes: coating a metal catalyst onto a surface of a substrate, placing the coated substrate in a furnace, heating the coated substrate; applying a force to the heated substrate while feeding a gas into the furnace, and diffusing a nanowire source from the heated substrate to grow the nanowire.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
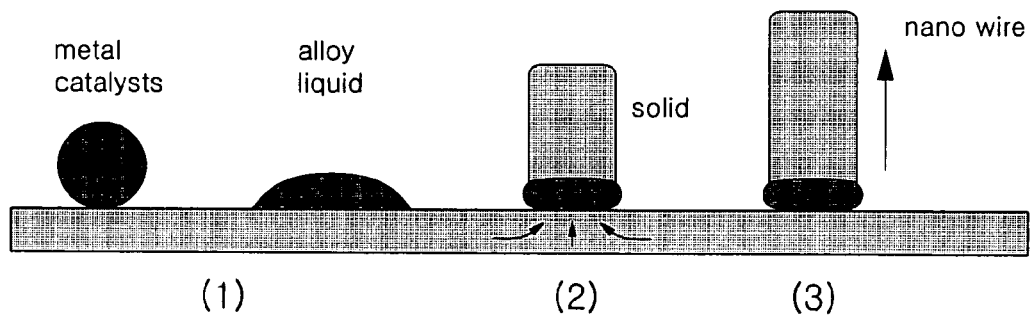
FIG. 1 is a schematic illustration of a solid-liquid-solid (SLS) method for producing nanowires.

The present invention will now be described more fully hereinafter with reference to the accompanying drawings, in which exemplary embodiments of the present invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In exemplary embodiments, the present invention is directed to a nanowire comprising a plurality of metal nanodots uniformly disposed therein and a core portion, wherein each of the plurality of metal nanodots is coupled to the core portion. By "uniformly disposed", it is meant that the metal nanodots are discrete and that no two of the plurality of metal nanodots are in physical contact with each other.

Figure 3:
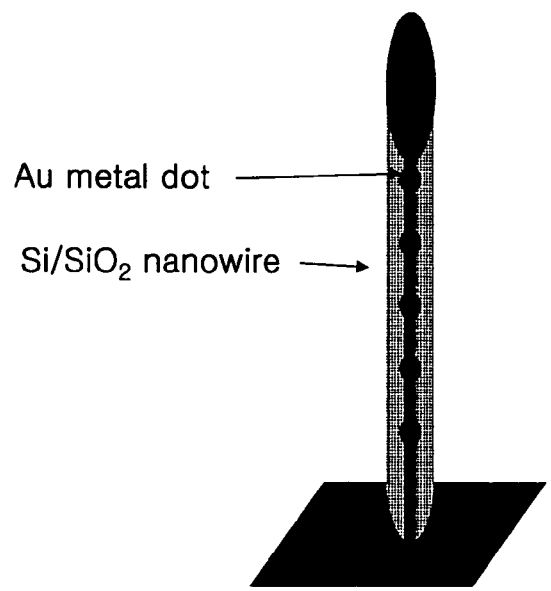
FIG. 3 is a schematic illustration of an exemplary embodiment of a nanowire according to the present invention.
Figure 4:
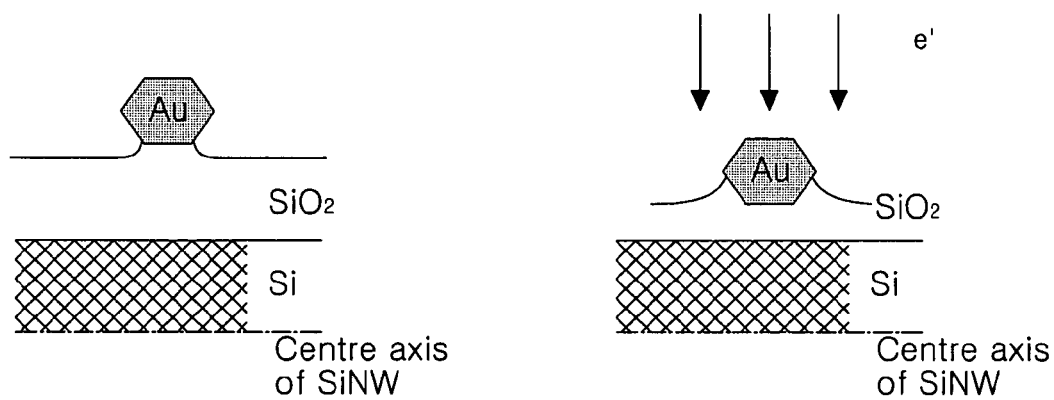
FIG. 4 is a schematic illustration of a method for introducing a metal nanodot into an already-formed nanowire in accordance with a prior art method.

FIG. 3 schematically illustrates an exemplary embodiment of a nanowire according to the present invention. Referring now to FIG. 3, gold (Au) nanodots are disposed in a line along the central or longitudinal axis of a $Si/SiO_2$ nanowire.

The nanowires can comprise a mixture of silicon (Si) and silica ($SiO_2$) or can be made of silica alone. Specifically, the nanowires of the present invention may have a structure wherein silicon is present in the core portion, silica is present in a sheath surrounding the core portion, and the plurality of metal nanodots are disposed along the central axis of the wire. Alternatively, the nanowires of the present invention may have a structure wherein silica ($SiO_2$) constitutes both the core portion and the sheath, and the plurality of metal nanodots is disposed along the central axis of the wire. The silica present on the surface (i.e., the sheath) is formed from the oxidation of silicon during production or due to the presence of oxygen in air.

Figure 5:
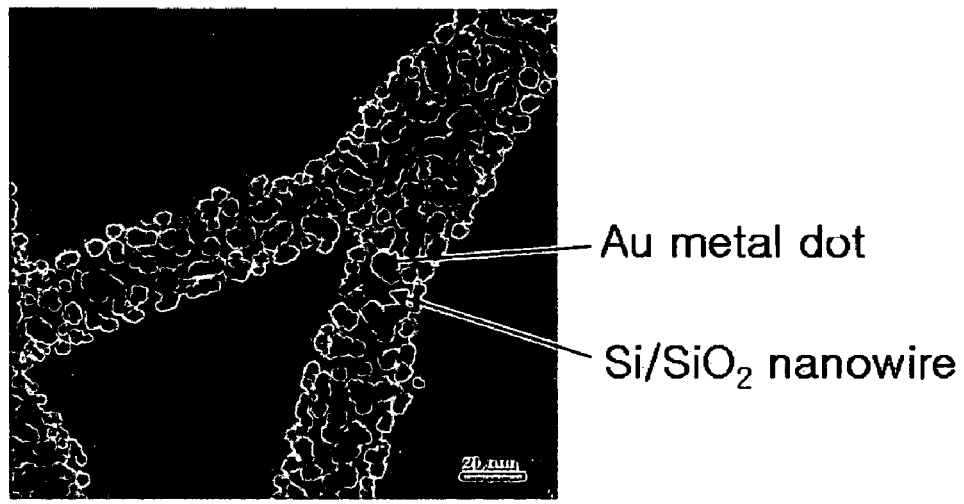
FIG. 5 is a transmission electron microscope (TEM) image of a nanowire in which metal nanodots are present on the surface or included in the nanowire in accordance with the prior art method of FIG. 4.

According to the prior art nanowire shown in FIG. 5, since the metal nanodots are randomly distributed within and on the nanowire, separation between the metal nanodots and silicon is not controlled, thus limiting the application of the nanowire. In contrast, the plurality of metal nanodots are arranged along the central axis of the nanowires of the present invention, thus facilitating the application of the nanowires to electronic devices and devices utilizing optical properties.

The plurality of metal nanodots is coupled to the core portion of the nanowires of the present invention. In an exemplary embodiment, the core portion can be made from crystalline silicon.

Any metal that can be used as a catalyst for nanowire growth can be used as the material for the plurality of metal nanodots disposed in the nanowires. Specifically, the metal nanodots can be selected from the group consisting of Au, Ni, Fe, Ag, Pd and Pd/Ni nanodots.

The nanowires of the present invention have a length of greater than or equal to about 10 nanometers (nm). The length of the nanowires can be controlled by varying the production time. The nanowires of the present invention have a diameter of less than or equal to about 500 nm. The average diameter of the plurality of metal nanodots disposed in the nanowires is not particularly limited. For example, the average diameter of the plurality of metal nanodots can be identical to or different from that of the overall nanowire itself. The metal nanodots may be disposed at intervals of about 10 nm to about 1 micrometer (μm).

In other exemplary embodiments, the present invention is directed to a method for producing the nanowires.

Silicon nanowires can be grown, for example, using vapor-liquid-solid (VLS) and solid-liquid-solid (SLS) methods. The method of the present invention is characterized by the use of a modified solid-liquid-solid (SLS) technique.

Figure 2:
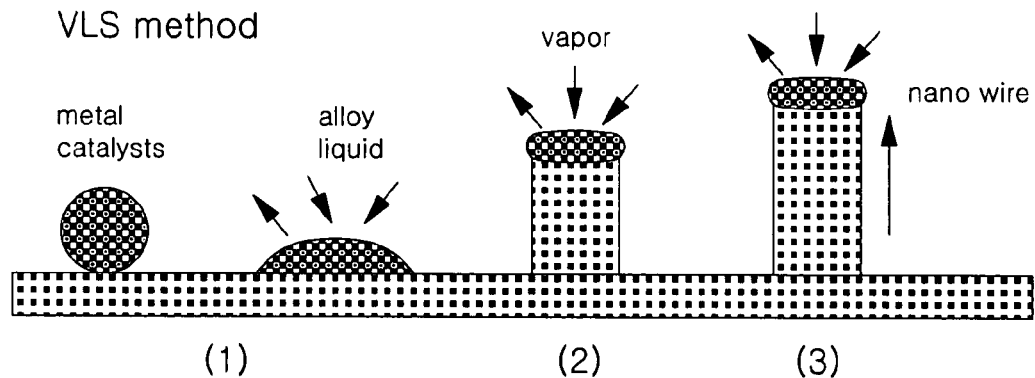
FIG. 2 schematic illustration of a vapor-liquid-solid (VLS) method for producing nanowires.

Specifically, according to a vapor-liquid-solid (VLS) method shown, for example, in FIG. 2, silicon nanowires are produced by supplying a vapor phase silicon-containing species to a high-temperature reaction furnace, condensing the silicon-containing species on the surface of a molten catalyst (e.g., molten gold, cobalt or nickel) to form a crystal, and growing the crystal.

In contrast, according to a solid-liquid-solid (SLS) method shown, for example, in FIG. 1, nanowires are produced by diffusing silicon from a solid substrate (e.g., a silicon substrate) without supplying a vapor phase silicon source, condensing the silicon on the surface of a molten catalyst to form a crystal, and growing the crystal.

According to an exemplary embodiment of the method of the present invention, the nanowires comprising the plurality of metal nanodots uniformly disposed therein can be produced using a modified solid-liquid-solid (SLS) method. The method of the present invention will be explained in more detail below.

First, a metal catalyst (e.g., gold) is coated on a solid substrate. The substrate can be previously washed or prepared by known techniques.

Since a solid-liquid-solid (SLS) method is employed in the method of the present invention, no wire source is provided and the substrate functions as the source of nanowires. Accordingly, the substrate may be of any type so long as it functions as a wire source. Specifically, in addition to a silicon substrate, glass and silicon-coated polymeric substrates can also be used.

The composition of the metal catalyst coated on the substrate is not particularly restricted, so long as it can be used to catalyze the nanowire growth on the substrate. Non-limiting examples of the metal catalyst include Au, Ni, Fe, Ag, Pd, and Pd/Ni.

The metal catalyst used in the present invention can be coated onto the substrate in the form of nanoparticles or a thin film. In an exemplary embodiment, the nanoparticle or thin film layer of metal catalyst coated onto the substrate has a thickness of less than or equal to about 50 nm.

The metal catalyst can be coated onto the substrate by a variety of coating techniques including chemical vapor deposition (CVD), sputtering, e-beam evaporation, vacuum deposition, spin coating, dipping, and the like.

The diameter of the nanowires can be controlled by varying the diameter of the metal catalyst.

The substrate, coated with the metal catalyst, is then placed in a furnace, wherein a force is applied to the substrate during heating, while a gas is fed into the furnace so that the metal is included in the nanowires upon growth of the nanowires.

The surface onto which the nanowires are to be grown is directed downward to ensure that the nanowires incorporate the metal. An electric field or a mechanical force can be applied to control the intervals between the nanodots, thus enabling the production of nanowires having specific physical properties.

Exemplary gases that can be used in the present invention include, but are not limited to, Ar, $N_2$, He, and $H_2$. In an exemplary embodiment, the gas is fed into the furnace at a flow rate of about 100 standard cubic centimeters per minute (sccm). However, the flow rate of the gas can be varied as desired.

The temperature to which the substrate is heated in the furnace can be about 800 degrees Celsius (°C.) to about 1200° C. The pressure under which the substrate is heated in the furnace can be less than or equal to about 760 torr. The duration of the heating can be about a few minutes to about a few hours. The heating conditions, including pressure, temperature, and time, may be varied to produce nanowires having specific properties as desired for a particular application.

In contrast to a vapor-liquid-solid (VLS) process wherein an additional vapor phase nanowire source must be supplied, the wire source of the modified solid-liquid-solid (SLS) method employed in the present invention is diffused from the substrate.

The number of metal nanodots within the nanowire is dependent on the amount of the metal catalyst coated on the substrate.

The length of the nanowires can be controlled by varying the heating temperature and time. The growth of the nanowires can be stopped by cooling the substrate under ambient conditions or flowing a different gas (e.g., nitrogen) over the substrate to cool the substrate to less than or equal to about 700° C.

As apparent from the foregoing, according to the method of the present invention, nanodot arrays can be disposed along the central axis of the nanowires, and nanowires having various physical properties can be produced by controlling the size and interval of the plurality of metal nanodots. Therefore, the nanowires of the present invention can be effectively used in a variety of applications, including electronic devices, such as field effect transistors (FETs), sensors, photodetectors, light emitting diodes (LEDs), and laser diodes (LDs).

Specifically, the electron mobility of the nanowires according to the present invention can be utilized in transistors and single electron transistors. The optical properties of the nanowires according to the present invention can be utilized in optical waveguides and nano-analyzers using the characteristics of a surface plasmon polariton, and highly sensitive signal detectors for cancer diagnosis.

Hereinafter, the present invention will be explained in more detail with reference to the following example. However, the example is given for the purpose of illustration and is not to be construed as limiting the scope of the invention.

EXAMPLE 1

Production of Silicon Nanowires

A natural oxide film was removed from a p-doped silicon substrate using an organic cleaning solvent or hydrofluoric acid. Gold (Au) nanoparticles (Nipponpaint Co., Ltd.) as catalyst particles were spin-coated onto the cleaned substrate to a thickness of about 30 nm. Subsequently, the coated substrate was placed in a reaction furnace, and the surface of the substrate onto which the nanowires would be grown was directed downward. The substrate was heated at a rate of about 10 to about 15° C. per minute, and maintained at a pressure of about 500 torr while argon (Ar) was fed into the furnace at a flow rate of about 100 sccm. The heated substrate was maintained at about 1000° C. for 30 minutes to grow the nanowires and metal nanodots. The resulting structure was slowly allowed to cool to about 700° C. under ambient conditions to complete the growth of the nanowires.

The structure of the nanowires was examined by transmission electron microscopy and energy dispersive X-ray spectroscopy (EDS) using a Tecnai G2 microscope (FEI). The results are shown in FIGS. 6 and 7.

Figure 6:
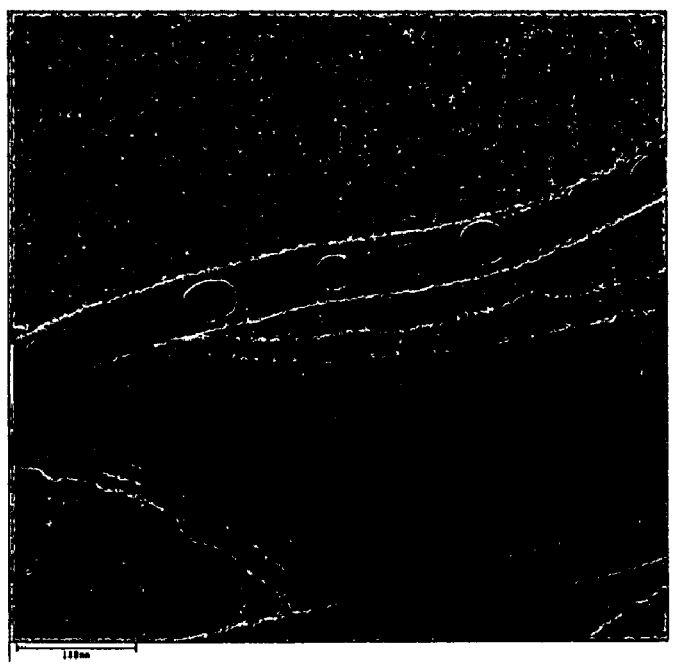
FIG. 6 is a TEM image of nanowires produced according to the exemplary embodiment described in Example 1 of the present invention.
Figure 7:
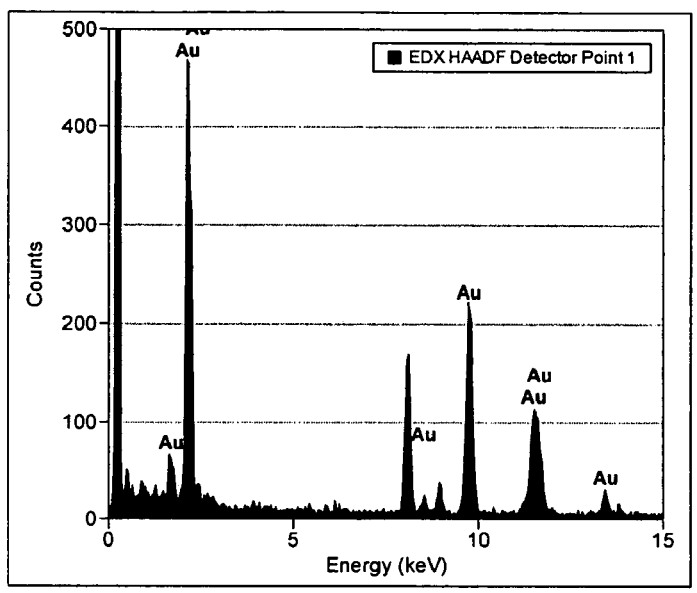
FIG. 7 is a graphical representation of an energy dispersive X-ray spectroscopy (EDS) spectrum taken of nanowires produced according to the exemplary embodiment described in Example 1 of the present invention.

The transmission electron microscope (TEM) image of FIG. 6 indicated that the metal nanodots were disposed in the silicon or silica nanowires. Furthermore, the EDS spectrum shown in FIG. 7 confirmed that the metal nanodots are gold nanodots.

Figure 8:
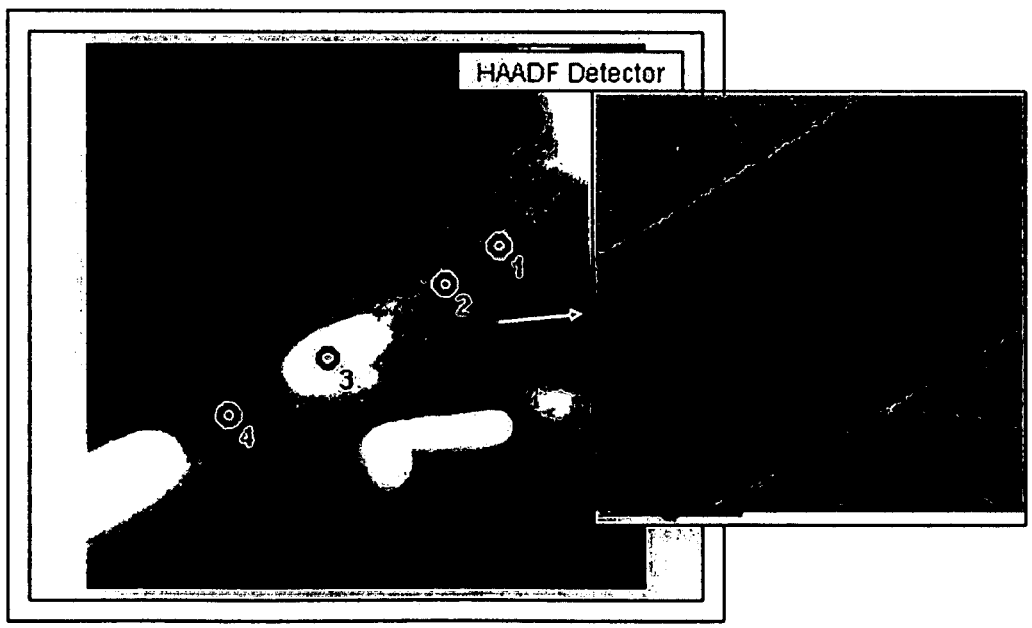
FIG. 8 is a TEM image showing the connectivity of the nanodots to the crystalline silicon of the nanowire core portion according to the exemplary embodiment described in Example 1 of the present invention.
Figure 9:
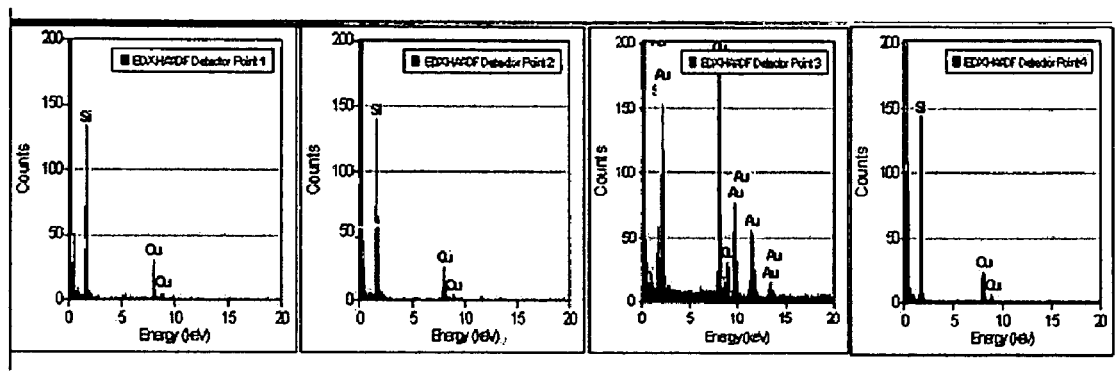
FIG. 9 is a graphical representation of EDS spectra taken at different positions of the nanowires produced according to the exemplary embodiment described in Example 1 of the present invention.

The TEM image of FIG. 8 revealed that the gold nanodots were connected to the crystalline silicon of the nanowire core portion; and the EDS spectra, each taken at a different location of the nanowire, shown in FIG. 9, confirmed that the composition of the grown nanowires included a silicon core portion and gold nanodots.

Although the present invention has been described herein with reference to the foregoing exemplary embodiments, these exemplary embodiments do not serve to limit the scope of the present invention. Accordingly, those skilled in the art to which the present invention pertains will appreciate that various modifications are possible, without departing from the technical spirit of the present invention.

What is claimed is:

1. A nanowire, comprising:
   a plurality of metal nanodots uniformly disposed therein; and
   a core portion, wherein each of the plurality of metal nanodots is coupled to the core portion.

2. The nanowire according to claim 1, wherein the plurality of metal nanodots are disposed along the central axis of the nanowire.

3. The nanowire according to claim 1, wherein the core portion comprises crystalline silicon.

4. The nanowire according to claim 1, wherein the plurality of metal nanodots are selected from the group consisting of Au, Ni, Fe, Ag, Pd and Pd/Ni nanodots.

5. The nanowire according to claim 1, wherein the nanowire comprises a mixture of silicon and silica.

6. The nanowire according to claim 1, wherein the nanowire comprises silica.

7. The nanowire according to claim 1, wherein the plurality of metal nanodots are disposed at intervals of about 10 nanometers to about 1 micrometer.

* * * * *